United States Patent
Quaderer

(10) Patent No.: US 7,496,271 B2
(45) Date of Patent: Feb. 24, 2009

(54) PRINTED CIRCUIT BOARD WITH RECESSED REGION

(75) Inventor: James Gerard Quaderer, Sunnyvale, CA (US)

(73) Assignee: Bookham Technology plc, Northamptonshire (GB)

( * ) Notice: Subject to any disclaimer, the term of this patent is extended or adjusted under 35 U.S.C. 154(b) by 0 days.

(21) Appl. No.: 11/788,275

(22) Filed: Apr. 19, 2007

(65) Prior Publication Data
US 2007/0274671 A1    Nov. 29, 2007

Related U.S. Application Data

(60) Provisional application No. 60/793,479, filed on Apr. 20, 2006.

(51) Int. Cl.
*G02B 6/00* (2006.01)
(52) U.S. Cl. .......................................... 385/147; 385/14
(58) Field of Classification Search ................... 385/14, 385/147
See application file for complete search history.

(56) References Cited
U.S. PATENT DOCUMENTS
2005/0265671 A1 * 12/2005 Ono et al. ...................... 385/92

OTHER PUBLICATIONS 2 pages that illustrate Bookham Pluggables sold by Bookham. The Applicant admits that this is prior art. As illustrated herein, the Bookham Pluggables include a ROSA, a flex cable, and a printed circuit board. The flex cable includes a plurality of tubular barrels that are soldered to ROSA pads on the ROSA. The ROSA/flex cable assembly is next soldered to the printed circuit board, Jul. 7, 2008.

* cited by examiner

*Primary Examiner*—Kevin S Wood
(74) *Attorney, Agent, or Firm*—Roeder & Broder LLP

(57) ABSTRACT

A printed circuit board (18) for electrically connecting to an optical subassembly (16) includes a board base (230), a conductive trace (232), and a board conductor (234). The optical subassembly (16) includes at least one component pad (346). The board base (230) is made of a substantially nonconductive material. Further, the board base (230) defines a recessed region (238) that is sized and shaped to receive a portion of the optical subassembly (16). The conductive trace (232) is secured to the board base (230). The board conductor (234) is positioned near the receiver region (238). Further, the board conductor (234) is positioned near the component pad (346) when the optical subassembly (16) is positioned in the receiver region (238). Moreover, the board conductor (234) is electrically connected to the conductive trace (232).

20 Claims, 5 Drawing Sheets

PRINTED CIRCUIT BOARD WITH RECESSED REGION

RELATED APPLICATION

This application claims priority on Provisional Application Ser. No. 60/793,479 filed on Apr. 20, 2006 and entitled "PRINTED CIRCUIT BOARD WITH RECESSED REGION". As far as is permitted, the contents of Provisional Application Ser. No. 60/793,479 are incorporated herein by reference.

BACKGROUND

Optical subassemblies such as receive optical subassemblies ("ROSA") are used to convert optical signals into electrical signals that can subsequently be analyzed. In certain designs, the ROSA is soldered to a flexible electrical circuit board that is subsequently attached to a rigid printed circuit board.

Unfortunately, the flexible circuit board does not rigidly secure the ROSA to the printed circuit board. Moreover, the soldering of the ROSA to the flexible circuit and flexible circuit to the printed circuit board can be time consuming and relatively difficult to perform. Moreover, circuit boards can be inconsistent. This can influence the performance of the optical subassembly.

SUMMARY

The present invention is directed to a printed circuit board for electrically connecting to an electrical component, such as an optical subassembly that includes at least one component pad. The printed circuit board includes a board base, a conductive trace, and a board conductor. The board base is made of a substantially nonconductive material. Further, the board base defines a recessed region that is sized and shaped to receive a portion of the electrical component. The conductive trace is secured to the board base. The board conductor is positioned near the receiver region. Further, the board conductor is positioned near the component pad when the electrical component is positioned in the recessed region. Moreover, the board conductor is electrically connected to the conductive trace.

With this design, in certain embodiments, the electrical component can be electrically and mechanically coupled to the printed circuit board in a relatively simple, secure, consistent and inexpensive fashion.

In one embodiment, the board conductor extends through the base board into the receiver region. Further, the board conductor can include a barrel and solder that electrically connects the barrel to the component pad.

In one embodiment, the board base includes a substantially nonconductive first layer and a substantially nonconductive second layer that is stacked on the first layer. In this embodiment, the recessed region is defined by an aperture that extends through the second layer. In one embodiment, the second layer is at least approximately 10 percent thicker than the first layer.

The present invention is also directed to a combination that includes an optical subassembly that is secured to the printed circuit board. In another embodiment, the present invention is directed to a precision apparatus including an analyzer and the combination. In yet another embodiment, the present invention is directed to a method for securing an electrical component to a printed circuit board.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
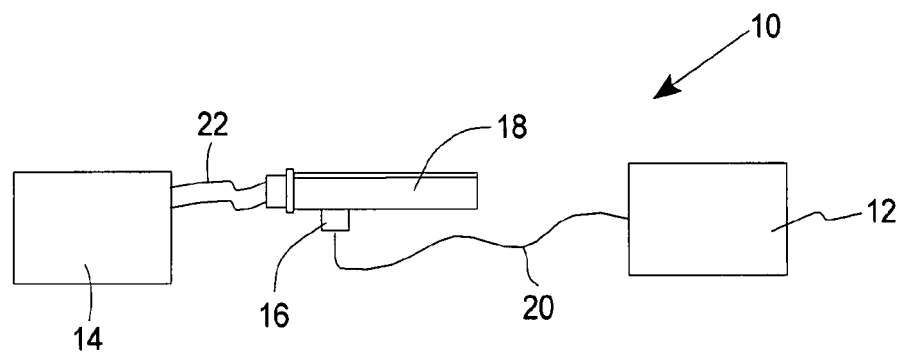
FIG. 1 is a simplified illustration of a precision apparatus having features of the present invention.

Referring initially to FIG. 1, the present invention is directed to a precision apparatus 10 that, for example, can be used as or in telecommunication equipment, data communication equipment, technical instruments, or scientific instruments. FIG. 1 is a simplified, non-exclusive view of one embodiment of the precision apparatus 10. In this embodiment, the precision apparatus 10 includes an optical source 12, an analyzer 14, an electrical component 16, e.g. an optical subassembly, and a printed circuit board 18. The design and orientation of the components of the precision apparatus 10 can be changed to suit the requirements of the precision apparatus 10. Additionally, the precision apparatus 10 can include more components or fewer components than that illustrated in FIG. 1.

As an overview, in certain embodiments, the printed circuit board 18 is uniquely designed so that the electrical component 16 can be electrically connected to and attached to the rigid printed circuit board 18 in a relatively simple and reliable fashion, and with minimal heat damage, or heat stress.

The optical source 12 generates an optical beam (not shown) that is analyzed by the rest of the precision apparatus. For example, the optical source 12 can be a laser source, or a light emitting diode ("LED"). Alternatively, the optical source 12 could be a remote instrument, such as a television remote control box. The optical source 12 could be to (not part of) the apparatus. In this case, for example, the light would shine into the end of the optical fiber 20, or the light would shine directly into the electrical component 16.

The analyzer 14 can be used to analyze the signal from the electrical component 16. For example, the analyzer 14 can be an oscilloscope, a spectrum analyzer, a telecom receiver, or a pulse detector.

The electrical component 16 is mechanically fixed and electrically coupled to the printed circuit board 18. In one embodiment, the electrical component 16 is an optical subassembly that receives the optical signal from the optical source 12 and converts the optical signal into an electrical signal for subsequent processing with the analyzer 14. For example, the optical subassembly 16 can be a receive optical subassembly (commonly referred to as a "ROSA"). In one embodiment, the ROSA includes a photodetector that converts light to electrical current and an amplifier that amplifies the current.

In another, non-exclusive embodiment, the electrical component 16 is an electrical transmitter that sends data or a signal to another location.

The printed circuit board 18 retains the optical subassembly 16 and is used to electrically connect the optical subassembly 16 to the analyzer 14. The printed circuit board 18 is described in more detail below.

Additionally, the precision apparatus 10 can include one or more optical fibers 20 that each carries one or more optical signals between the optical source 12 and the optical subassembly 16, and one or more electrical lines 22 that electrically connects the printed circuit board 18 to the analyzer 14.

Additionally, the apparatus 10 can include multiple other components that are not shown in FIG. 1. For example, the apparatus 10 can include one or more lasers, receivers, and amplifiers that are not shown.

Figure 2A:
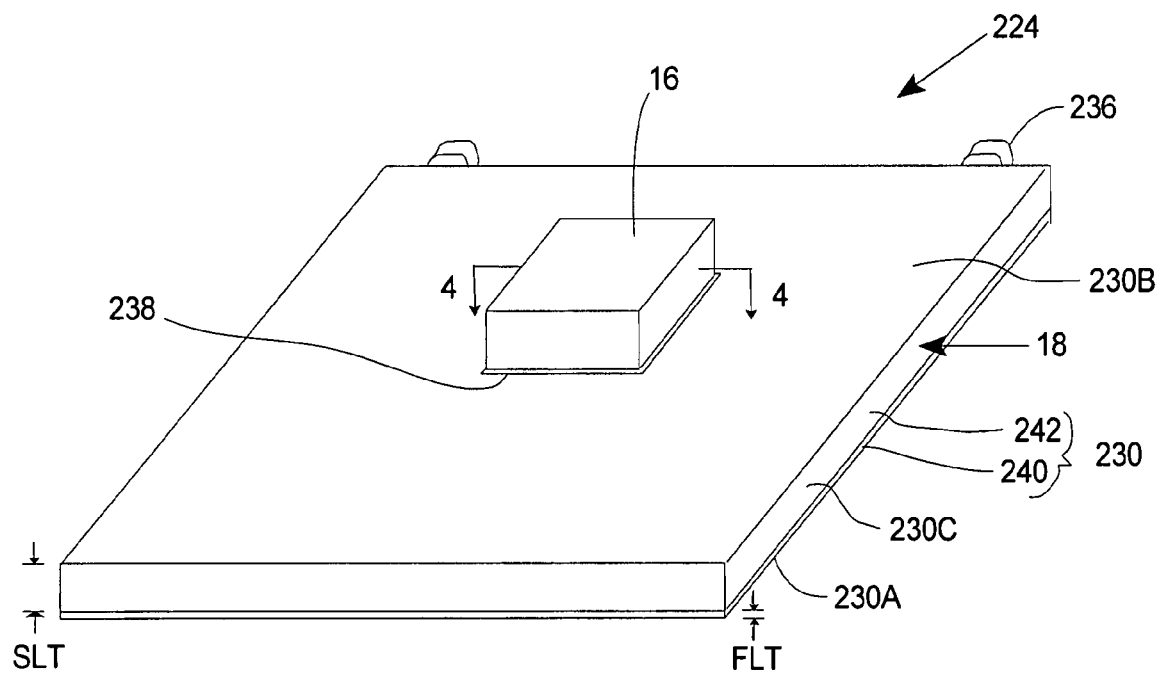
FIG. 2A is a bottom perspective view of a combination having features of the present invention.
Figure 2B:
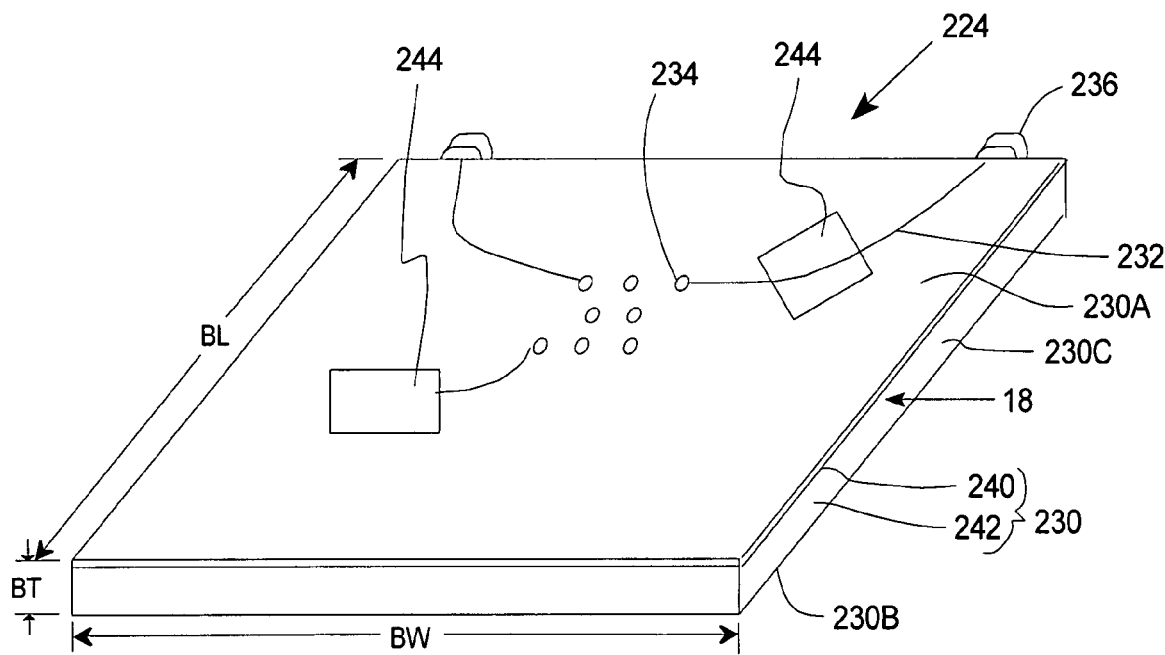
FIG. 2B is a top perspective view of the combination of FIG. 2A.

FIG. 2A is a bottom perspective view and FIG. 2B is a top perspective view of a combination 224 that includes the optical subassembly 16 and the printed circuit board 18. In this embodiment, the optical subassembly 16 is generally rectangular box shaped and the printed circuit board 18 is rectangular plate shaped. Alternatively, one or both of these components can have another configuration.

The design of the printed circuit board 18 can vary pursuant to the teachings provided herein. In one embodiment, the printed circuit board 18 includes a board base 230, a plurality of conductive traces 232 (only three are illustrated), a plurality of board conductors 234, and a plurality of end launch connectors 236.

The board base 230 is generally rectangular plate shaped, generally rigid, and is made of a substantially nonconductive material. In one embodiment, the board base 230 has a base length BL of approximately 1.8 inches, a base width BW of approximately 1.6 inches, and a base thickness BT of approximately 0.625 inches. Alternatively, board base 230 can have another shape or size. In this embodiment, the board base 230 includes a top 230A, an opposed bottom 230B and four sides 230C. It should noted that the terms top 230A and bottom 230B are merely used for convenience of reference and that these surfaces can be switched.

In the embodiment illustrated in FIGS. 2A and 2B, the board base 230 includes a recessed region 238 that is sized and shaped to receive a portion of the optical subassembly 16. Stated in another fashion, the recessed region 238 can have a size and configuration that is similar to the cross-sectional size and configuration of the optical subassembly 16. The recessed region 238 can also be referred to as a well.

In FIGS. 2A and 2B, the optical subassembly 16 is generally rectangular shaped and the recessed region 238 is a generally rectangular shaped aperture that extends into a portion of the board base 230 from the bottom 230B towards the top 230A. Alternatively, if the optical subassembly 16 has another configuration, the recessed region 238 can have another matching configuration. In certain embodiments, because a portion of the optical subassembly 16 fits within the recessed region 234, the sides of recessed region 234 assist in inhibiting movement of the optical subassembly 16 and the overall height of the combination 224 is reduced.

In one embodiment, the board base 230 is made of a substantially nonconductive first layer 240, and a substantially nonconductive second layer 242 that is stacked on the first layer 240. In this embodiment, the first layer 240 defines the top 230A and the second layer 242 defines the bottom 230B. Further, the recessed region 234 is defined by an aperture that extends through the second layer 242. Moreover, the layers 240, 242 can be secured together with an adhesive or another fashion.

In certain embodiments, the thickness of the layers 240, 242 are different. For example, the first layer 240 can have a FL thickness FLT of approximately 0.004 inches and the second layer 242 can have a SL thickness SLT of approximately 0.056 inches. Stated in another fashion, in alternative, nonexclusive examples, the FL thickness FLT can be approximately 5, 10, 14, 15, 16 or 20 times less than the SL thickness SLT.

Further, in this embodiment, each of the layers 240, 242 is generally rigid, and flat plate shaped, and can be made of nonconductive material, such as plastic, ceramics or fiberglass. One non-exclusive example of a suitable material is FR4, that is rigid, withstands relatively high temperatures, and is a good insulator.

It should be noted that the first layer 240 can be made of a plurality of separate first sub-layers (not shown) that are stacked together and/or the second layer 242 can be made of a plurality of separate second sub-layers (not shown) that are stacked together.

The conductive traces 232 are secured to the board base 230 and are used to electrically connect the electrical components that are secured to printed circuit board 18. The number of conductive traces 232 will vary according to the number and type of electrical components coupled to the printed circuit board 18. In FIG. 2B, the printed circuit board 18 includes three conductive traces 232. In one embodiment, each of the conductive traces 232 is a 50 ohm trace. Alternatively, the printed circuit board 18 can be made with more than three conductive traces 232 and/or one or more of the conductive traces can be another type of trace.

Figures 8A, 8B:
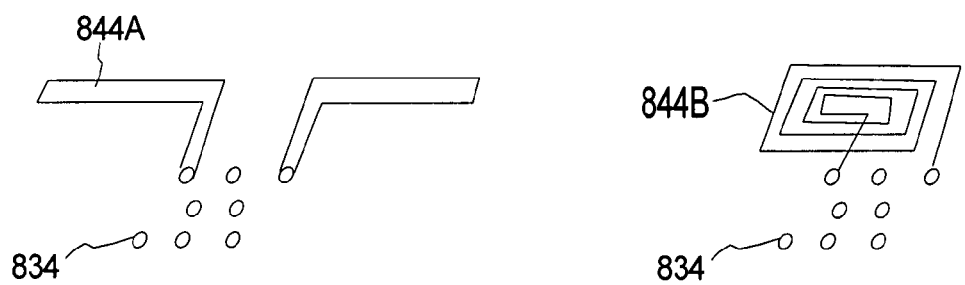
FIGS. 8A-8C are three alternative illustrations of possible board component layouts.
Figure 8C:
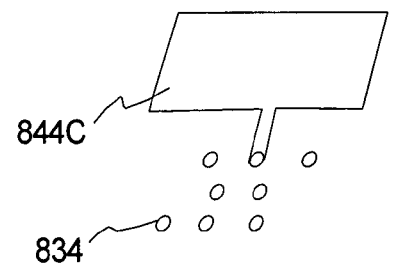

It should be noted that the printed circuit board is commonly designed to retain multiple additional board components 244 and the printed circuit board would include multiple additional conductive traces 232 electrically connected to the board components 244. For example, one or more of the board components 244 can be an electronic component such as a connector, a resistor, a capacitor, an inductor, ferrite bead, ICs, or another type of electronic component. Alternatively, for example, one or more of the board components 244 can be an antenna that is used to transmit and/or receive signals. For example, the antenna can be implemented in the copper traces and/or the copper planes within the circuit board 18. The antenna could be built directly within the circuit board 18 as illustrated in FIGS. 8A-8C.

The board conductors 234 are used to electrically connect to the optical subassembly 16. The number and design of the board conductors 234 can vary according to the design of the optical subassembly 16. In FIG. 2B, the printed circuit board 18 includes eight spaced apart board conductors 234. Alternatively, for example, the printed circuit board 18 can include more than eight or less than eight spaced apart board conductors 234. The design of board conductors 234 is discussed in more detail below.

As provided above, the printed circuit board is commonly designed to retain multiple additional electrical components (244) and the printed circuit board 18 would include multiple additional board conductors 234.

The end launch connectors 236 provide a way to easily couple the electrical lines 22 (illustrated in FIG. 1) to the printed circuit board 18. The number and design of the end launch connectors 236 can vary according to the design of the electrical lines 22. In FIG. 2B, the printed circuit board 18 includes two spaced apart end launch connectors 236. Alternatively, for example, the printed circuit board 18 can include more than two or less than two spaced apart end launch connectors 236. In one embodiment, each of the end launch connectors 236 is an end-launch SMA type electrical connector.

It should be noted that in FIG. 2B, one conductive trace 232 electrically connects one of the board conductors 234 to one of the end launch connectors 236 and another conductive trace 232 electrically connects one of the board conductors 234 to one of the end launch connectors 236.

Figure 3A:
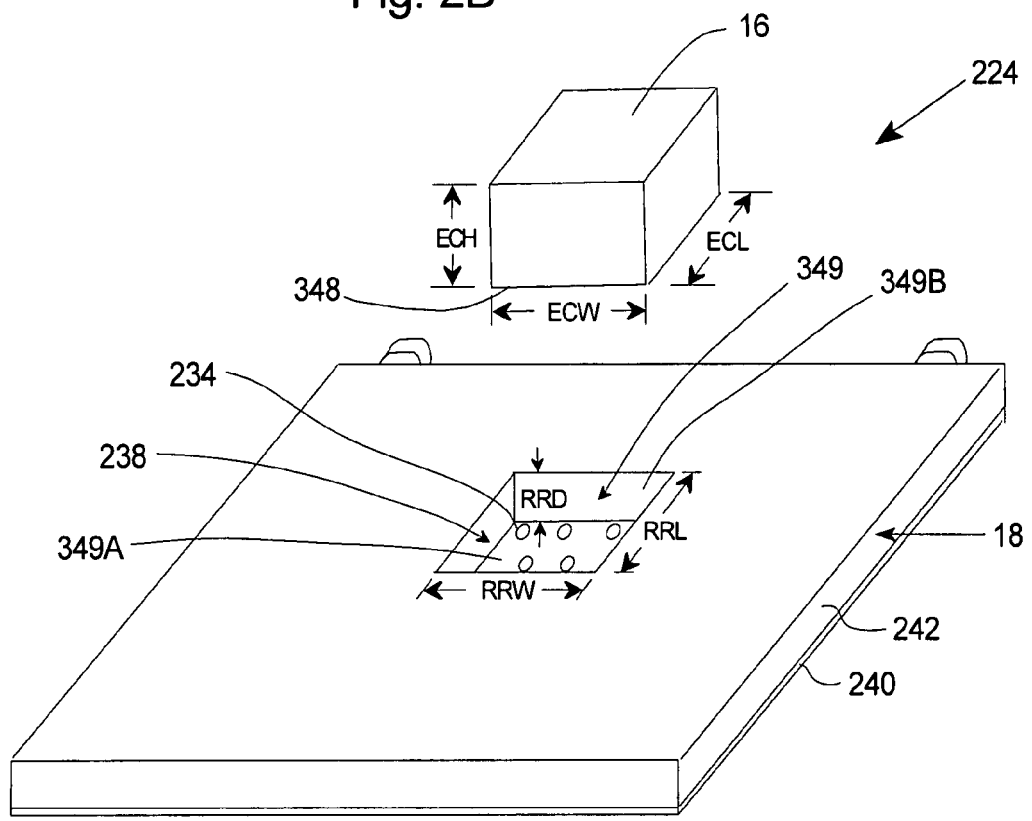
FIG. 3A is a partly exploded perspective view of the combination of FIG. 2A.
Figure 3B:
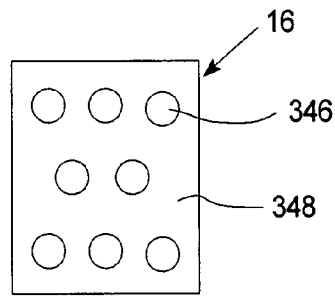
FIG. 3B is a bottom plan view of an electrical component having features of the present invention.

FIG. 3A is a partly exploded perspective view of the combination 224 and FIG. 3B is a bottom view of the electrical component 16. FIG. 3A illustrates that the electrical component 16 is generally rectangular block shaped. In one embodiment, the electrical component 16 has a width ECW of approximately 0.15 inches, a length ECL of approximately 0.2 inches, and a height ECH of approximately 0.3 inches. However, the electrical component 16 can be another size or have another configuration.

Additionally, FIG. 3B illustrates that the electrical component 16 includes at least one, electrically conductive, component pad 346. In FIG. 3B, the optical subassembly 16 includes eight spaced apart component pads 346. Alternatively, for example, the optical subassembly 16 can include more than eight or less than eight spaced apart component pads 346.

It should be noted that the component pads 346 are positioned on a subassembly surface 348 of the electrical component 16 that is positioned within the recessed region 238 and adjacent to first layer 240 of the printed circuit board 18 when the electrical component 16 is positioned within the recessed region 238.

Additionally, it should be noted that in certain embodiments, the spacing and location of the component pads 346 correspond to the spacing and location of the board conductors 234. Stated in another fashion, when the electrical component 16 is positioned within the recessed region 238, each of the component pads 346 is positioned adjacent to a corresponding board conductor 234.

Further, FIG. 3A illustrates that the board conductors 234 extend through the first layer 240 into the recessed region 238.

Additionally, FIG. 3A illustrates that the recessed region 238 is generally rectangular box shaped. In one embodiment, the recessed region 238 had a width RRW of approximately 0.15 inches, a length RRL of approximately 0.2 inches, and a depth RRD of approximately 0.056 inches. Moreover, in this embodiment, the recessed region 238 depth RRD is almost equal to the thickness of the second layer 242. However, the recessed region 238 can be another size or have another configuration.

Further, it should be noted that the recessed region 238 defines one or more walls 349 that inhibit the electrical component 16 from moving relative to the printed circuit board 18. In FIG. 3A, the recessed region 238 includes a bottom wall 349A and four side walls 349B.

Figure 4:
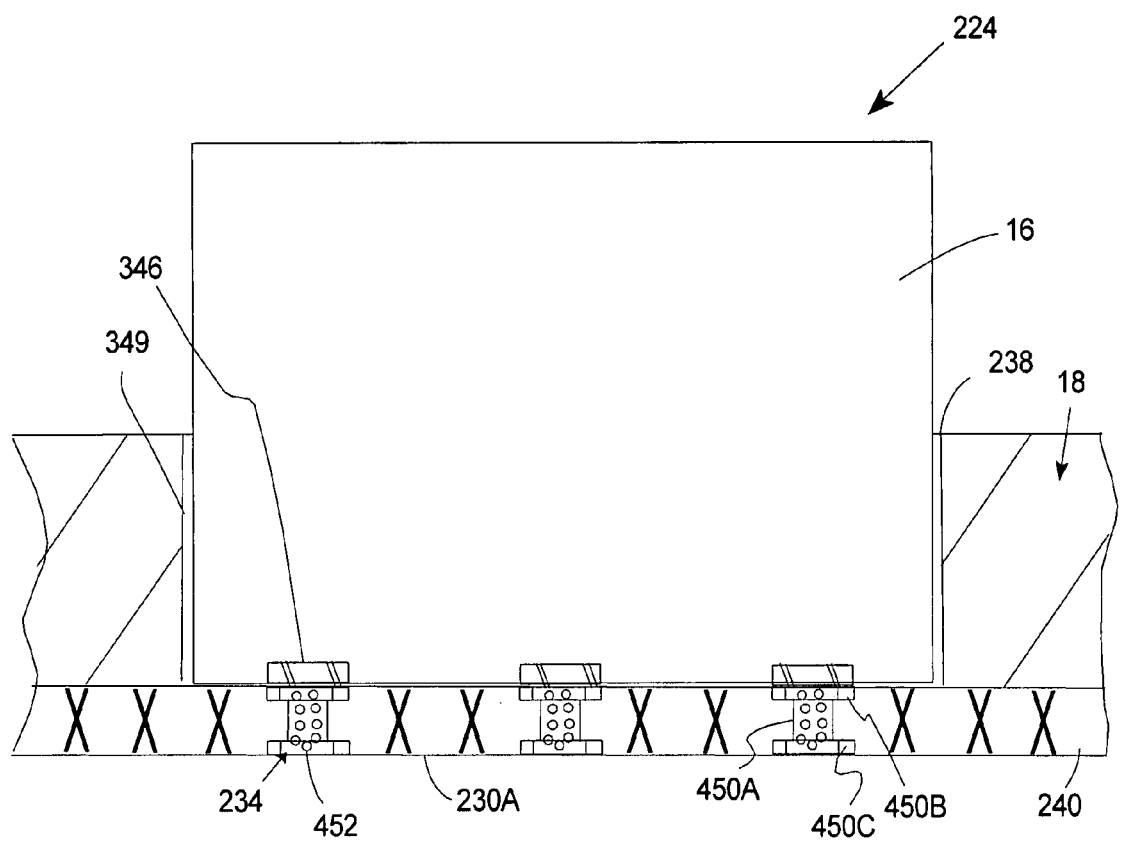
FIG. 4 is a cut-away view taken on line 4-4 in FIG. 2A.

FIG. 4 is a cut-away view taken on line 4-4 in FIG. 2A. FIG. 4 illustrates that a portion of the electrical component 16 fits and is positioned within the recessed region 238. With this design, the combination 224 has a lower height, approximately 0.304 inches in one embodiment.

Further, the walls 349 of the recessed region 238 inhibit movement of the optical subassembly 16 relative to the printed circuit board 18 along at least two axes and about one axis.

Additionally, FIG. 4 illustrates that the component pads 346 are positioned adjacent to the respective board conductors 234. Further, FIG. 4 illustrates that in one embodiment, each of the board conductors 234 can include a tubular shaped, conductive barrel 450A, a conductive, annular shaped first ring 450B, and a conductive, annular shaped second ring 450C. In FIG. 4, each of the board conductors 234 extends completely through the first layer 240 into the recessed region 238.

Additionally, each of the board conductors 234 can be fixedly and electrically connected to a corresponding component pad 346 with solder 452 (illustrated as circles). In one embodiment, after the electrical component 16 is positioned within the recessed region 238, the solder 452 can be applied from the top 230A into each of the board conductors 234. As a result of this design, the electrical component 16 is electrically connected to and mechanically attached to the rigid, printed circuit board 18 in a relatively simple and reliable fashion.

Figure 5:
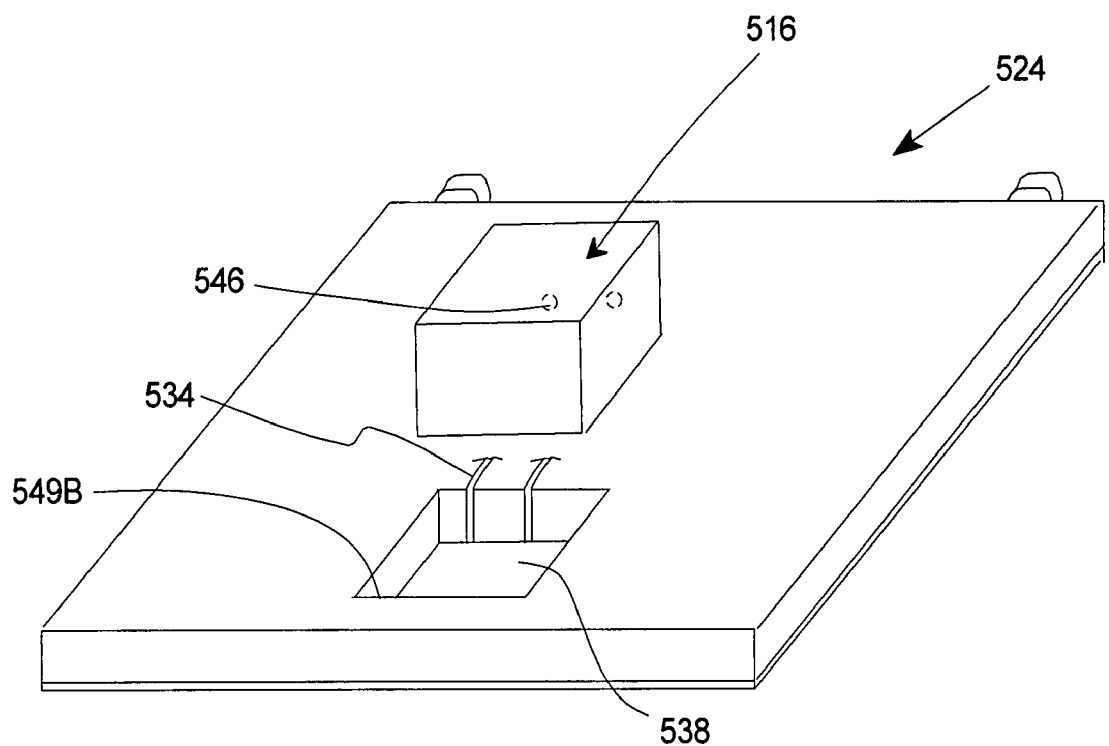
FIG. 5 is a partly exploded perspective view of another combination having features of the present invention.

FIG. 5 is a partly exploded perspective view of another combination 524 having features of the present invention that is somewhat similar to the combination 324 described above. However, in this embodiment, the component pads 546 (illustrated in phantom) of the electrical component 516 are positioned on a side of the electrical component 516. Further, the board conductors 534 extend along a side wall 549B of the recessed region 538.

Figure 6:
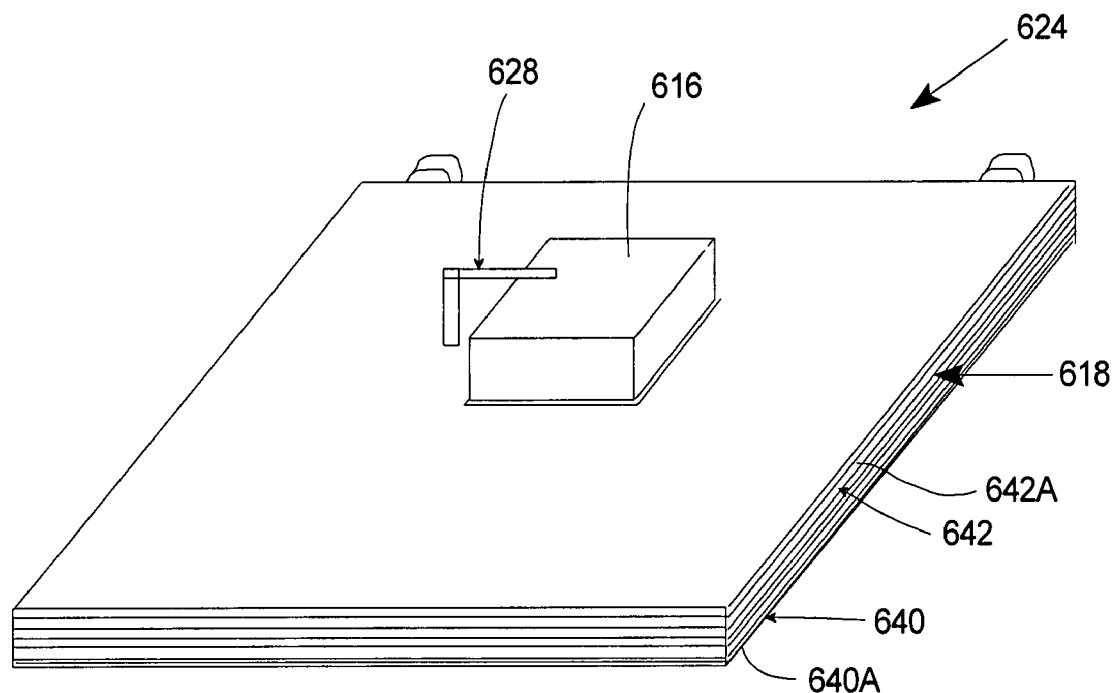
FIG. 6 is a bottom perspective view of still another combination having features of the present invention.

FIG. 6 is a bottom perspective view of still another combination 624 having features of the present invention that is somewhat similar to the combination 324 described above. However, in this embodiment, the printed circuit board 618 includes an attacher 628 that mechanically secures the electrical component 616 to the printed circuit board 618. With this design, the component pads (not shown in FIG. 6) of the electrical component 616 may not have to be soldered to the board conductors (not shown in FIG. 6) of the printed circuit board 618. For example, the attacher 628 can include a latch, a clamp, or another type of fastener that presses the electrical component 616 against the printed circuit board 618.

It should be noted that in this embodiment, the first layer 640 can be made of a plurality of separate first sub-layers 640A that are stacked together and the second layer 642 can be made of a plurality of separate second sub-layers 642A that are stacked together. The number of sub-layers can vary. For each of the layers 640, 642 can include 2, 4, 6, 8, or more sub-layers 640A, 640B.

Figure 7:
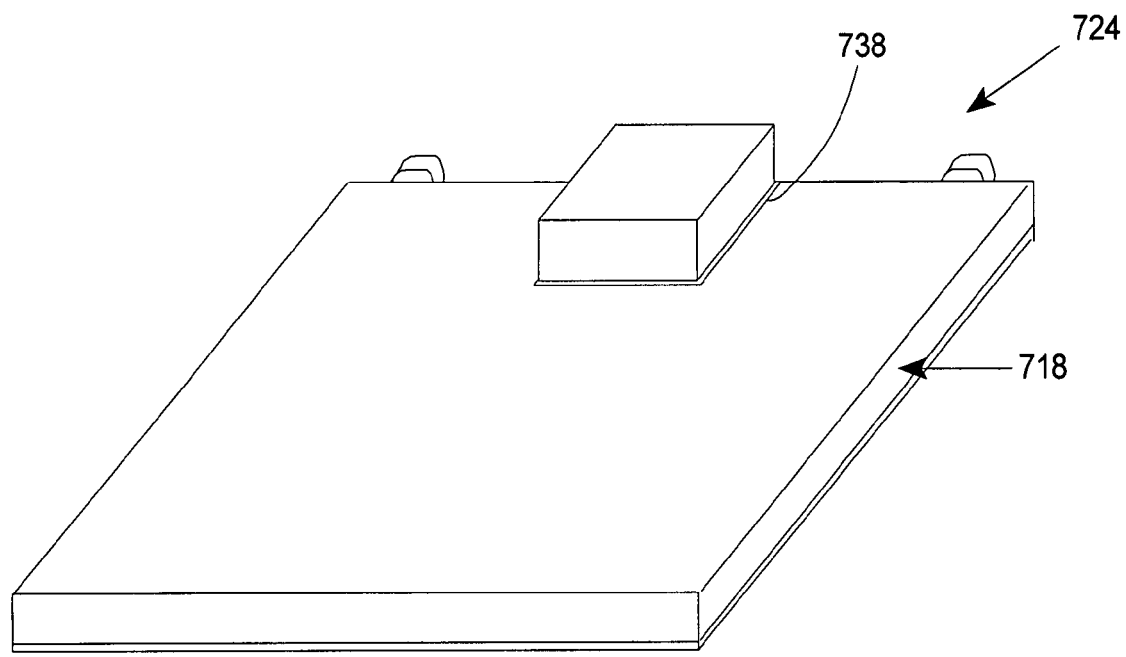
FIG. 7 is a bottom perspective view of yet another combination having features of the present invention.

FIG. 7 is a bottom perspective view of yet another combination 724 having features of the present invention that is somewhat similar to the combination 324 described above. However, in this embodiment, the recessed region 738 is positioned near the edge of the printed circuit board 718.

FIGS. 8A-8C are three alternative illustrations of possible board component layouts that can be used for the printed circuit boards described herein. More specifically, FIGS. 8A-8C illustrate the board conductors 834 and three, non-exclusive different antennas 844A, 844B, 844C that can be implemented on a printed circuit board. More specifically, (i) in FIG. 8A, the antenna 844A is a copper trace that forms a dipole type antenna, (ii) in FIG. 8B, the antenna 844B is a copper trace that forms a magnetic field antenna that can be used for RFID applications, and (iii) in FIG. 8C, the antenna 844C is a copper plate that forms an electric field antenna that can be used for RFID applications.

It should be noted that in the embodiments described herein, that either the component pads or the board conductors could be conductive "Bumps". The board conductors or the component pads can be springy, flexible conductors such as POGO pins commonly used in component test equipment.

While the particular apparatus 10 as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A printed circuit board for electrically connecting to an electrical component, the electrical component including at least one conductive component pad, the printed circuit board comprising:
   a board base that is made of a substantially nonconductive material, the board base defining a recessed region that is sized and shaped to receive a portion of the electrical component;
   a conductive trace that is secured to the board base; and
   a board conductor secured to the board base near the recessed region, the board conductor being positioned near the component pad when the electrical component is positioned in the recessed region, the board conductor being electrically connected to the conductive trace; wherein the board conductor includes a barrel and solder that electrically and directly connects the barrel to the component pad.

2. The printed circuit board of claim 1 wherein the board conductor extends through the board base into a bottom wall of the recessed region.

3. The printed circuit board of claim 1 wherein the barrel is tubular shaped and the solder is at least partly positioned within the barrel.

4. The printed circuit board of claim 1 wherein the board base includes a substantially nonconductive first layer and a substantially nonconductive second layer that is stacked on the first layer.

5. The printed circuit board of claim 4 wherein the recessed region is defined by an aperture that extends through the second layer.

6. The printed circuit board of claim 1 wherein the board conductor extends through a side wall of the receiver region.

7. The printed circuit board of claim 1 further comprising an attacher for mechanically attaching the electronic component to the board base.

8. The printed circuit board of claim 1 wherein the recessed region defines a plurality of walls that inhibit movement of the electrical component relative to the printed circuit board along at least one axis.

9. The printed circuit board of claim 1 further comprising a board component that is electrically connected to conductive trace.

10. A combination including an optical subassembly and the printed circuit board of claim 1 retaining the optical subassembly.

11. A precision apparatus including an analyzer and the combination of claim 10.

12. A combination for use in a precision apparatus, the combination comprising:
    an optical subassembly that includes at least one conductive component pad; and
    a printed circuit board that retains the optical subassembly, the printed circuit board comprising (i) a board base that is made of a substantially nonconductive material, the board base defining a recessed region that is sized and shaped to receive a portion of the optical subassembly; (ii) a conductive trace that is secured to the board base; and (iii) a board conductor positioned near the recessed region, the board conductor being positioned near the component pad when the optical subassembly is positioned in the recessed region, the board conductor being fixedly and electrically connected to the conductive trace, the board conductor extending through the board base into the recessed region; wherein the board conductor includes a barrel and solder that electrically and directly connects the barrel to the component pad.

13. The combination of claim 12 wherein the barrel is tubular shared and the solder is at least partly positioned within the barrel.

14. The combination of claim 12 wherein the board base includes a substantially nonconductive first layer and a substantially nonconductive second layer that is stacked on the first layer.

15. The combination of claim 14 wherein the recessed region is defined by an aperture that extends through the second layer.

16. The combination of claim 15 wherein the second layer is at least approximately 10 percent thicker than the first layer.

17. The combination of claim 12 wherein the recessed region defines a plurality of walls that inhibit movement of the optical subassembly relative to the printed circuit board along at least one axis.

18. A precision apparatus including an analyzer and the combination of claim 12.

19. A method for electrically connecting an electrical component in a precision apparatus, the method comprising the steps of:
    providing a printed circuit board that retains the electrical component, the printed circuit board comprising (i) a board base that is made of a substantially nonconductive material, the board base defining a recessed region that is sized and shaped to receive a portion of the electrical component; (ii) a conductive trace that is secured to the board base; and (iii) a board conductor positioned near the recessed region, the board conductor being positioned near the component pad when the electrical component is positioned in the recessed region, the board conductor including a barrel that extends through the base board into the recessed region; and
    fixedly securing the barrel to a conductive component pad of the electrical component with solder.

20. The method of claim 19 wherein the step of providing a printed circuit board includes providing a board base that includes a substantially nonconductive first layer and a substantially nonconductive second layer that is stacked on the first layer, and wherein the recessed region is defined by an aperture that extends through the second layer.

* * * * *